US005864582A

United States Patent [19]

Ander et al.

[11] Patent Number: 5,864,582

[45] Date of Patent: Jan. 26, 1999

[54] PULSE WIDTH EXTENSION WITH ANALOG COMMAND

[75] Inventors: Anthony Tomas Ander, Plymouth; Gerald A. Gyomory, Taylor, both of Mich.

[73] Assignee: Ford Global Technologies, Inc., Dearborn, Mich.

[21] Appl. No.: 806,264

[22] Filed: Feb. 24, 1997

[51] Int. Cl.[6] ........ H03K 7/08

[52] U.S. Cl. ........ 375/238; 375/238; 340/825.63; 329/312; 332/109; 364/709.01; 364/709.09; 364/709.11

[58] Field of Search ........ 375/238; 341/53; 340/825.63; 329/312; 332/109; 364/709.01, 709.09, 709.11, 709.12, 708, 709.02

[56] References Cited

U.S. PATENT DOCUMENTS

| | | | |
|---|---|---|---|
| 3,959,586 | 5/1976 | Blomenkamp | 325/141 |
| 4,387,392 | 6/1983 | Grattoni et al. | 358/111 |
| 4,509,180 | 4/1985 | Neyer | 375/76 |
| 5,099,444 | 3/1992 | Wilson et al. | 364/709.09 |

*Primary Examiner*—Stephen Chin
*Assistant Examiner*—Tuan Le
*Attorney, Agent, or Firm*—Peter Abolins

[57] ABSTRACT

A method of modulating the pulse width of a pulse width signal in response to an analog signal. The steps include changing the analog signal to a digital signal, changing the digital signal to a number of counts, changing the number of counts to a time delay, and then using the logic circuit to combine the time delay with a pulse with modulated input to change the pulse width of an output signal.

5 Claims, 2 Drawing Sheets

PULSE WIDTH EXTENSION WITH ANALOG COMMAND

BACKGROUND OF THE INVENTION

1. Field of the Invention

This invention relates to pulse width modulation.

2. Prior Art

For information transmission over distances, it is often desirable to encode such information upon a carrier signal. Various types of modulating signals are known. For example, an analog modulated (AM) signal, such as that used in AM radio transmissions, is a carrier signal with a certain frequency, and its amplitude is modulated with the information to be transmitted. If the information to be transmitted is analog, then an analog to AM conversion has to be done. Similarly, if a frequency modulation (FM) is desired, and if the information source is analog, an analog to FM conversion is necessary. When information is received, a decoding process is necessary. Various electronic circuits, including integrated circuits, exist to convert analog information into AM or FM signals, or AM or FM signals into analog information. Often, there is need to encode information by modifying the pulse width of a carrier, called a pulse width modulated (PWM) signal, or to extract information from a PWM signal. To date, there is no easy way to do this.

In automotive applications, for example, the exhaust gas sensor generates a PWM type signal which contains information about oxygen content. The engine controller continuously monitors the rising and falling edges of the PWM, thus using up important hardware and software resources. If the PWM were converted to an analog signal, such resources could be freed and an analog to digital channel used instead, thus resulting in possible cost savings.

Another automotive application where a PWM signal is present is spark advance command encoding. The spark advance command, which is sent to the ignition module by the engine controller, is a PWM signal in some vehicles. Often, while developing new or improved vehicle functionalities, it is desirable to modify the command generated by the engine controller without having to modify the engine controller's software, a time and resource consuming task. One possible solution is to intercept the PWM signal and to modify its pulse width (stretch or compress) based on an analog command. This modified pulse width is then sent to the ignition module.

The automotive examples above show the need for PWM to analog and analog to PWM conversions, which is the subject of the present invention.

SUMMARY OF THE INVENTION

This invention includes a method of modulating the pulse width of a pulse width signal in response to an analog signal. The steps of the inventive method include changing the analog signal to a digital signal, changing the digital signal to a number of counts, changing the number of counts to a time delay, and then using the logic circuit to combine the time delay with a pulse with modulated input to change the pulse width of an output signal.

DETAILED DESCRIPTION OF THE INVENTION

Figure 1A:
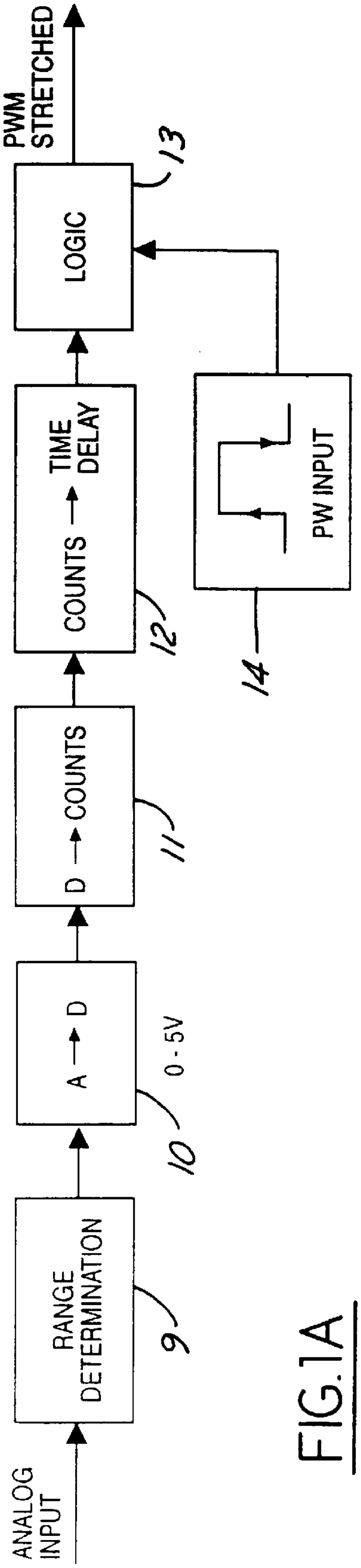
FIG. 1A is a block diagram of a method of modulating a pulse width signal with an analog signal input in accordance with an embodiment of this invention.

Referring to FIG. 1A, a method in accordance with an embodiment of this invention includes a block 9 where the range of an analog input signal is bounded within a predetermined range. A voltage offset may also be added in block 9, whereby the analog input signal will be within a predetermined operating range. Further, the added offset voltage may provide noise immunity. The bounded signal is applied to a block 10 wherein it is converted to a digital signal, which is then coupled to a block 11 wherein the digital signal is converted to counts. Logic flow from block 11 goes to a block 12 where the counts are converted to a time delay. A logic block 13 receives inputs from block 12 and a block 14 which provides a pulse width input. The output of logic block 13 is a PWM signal which is modified in accordance with the input to block 9. Thus, voltage is converted to pulse width. This is in contrast to converting voltage to frequency, which is more easily known.

Figure 1B:
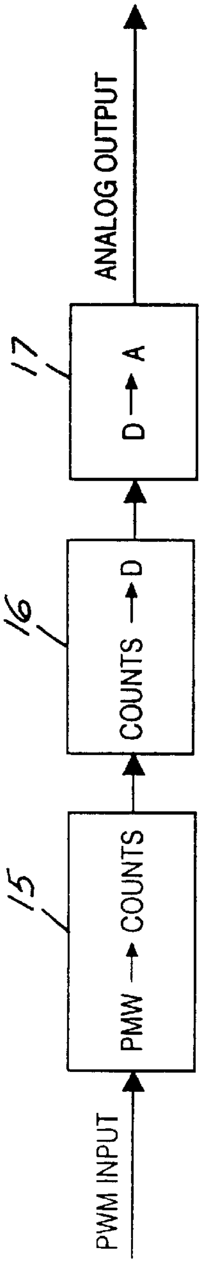
FIG. 1B is a block diagram of a method of modulating an analog signal with a pulse width signal input in accordance with an embodiment of this invention.

Referring to FIG. 1B, the reverse is also possible by applying a PWM signal to the input of a block 15. Block 15 changes the PWM signal to a number of counts. Logic flow from block 15 goes to a block 16 wherein the counts are converted to a digital signal. Logic flow from block 16 goes to a block 17 wherein the digital signal is converted to an analog signal.

Figure 2A:
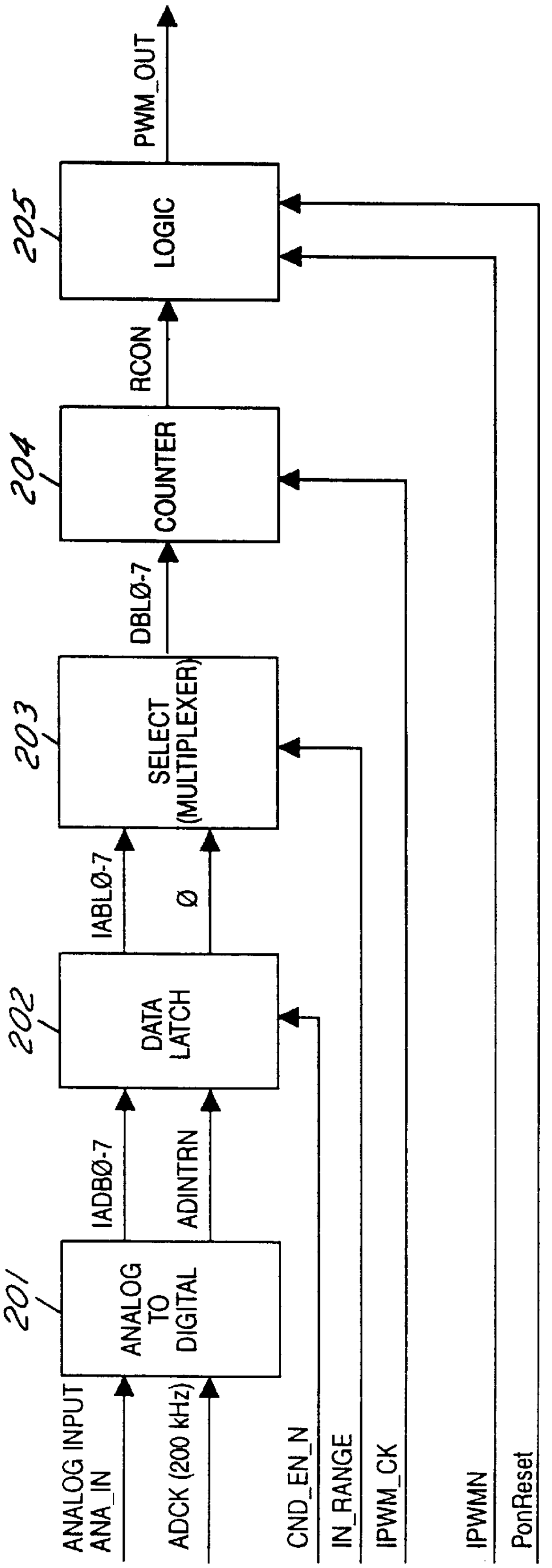
FIG. 2A is a block diagram showing an apparatus for modulating a pulse width signal with an analog signal input as embodied by this invention.
Figure 2B:
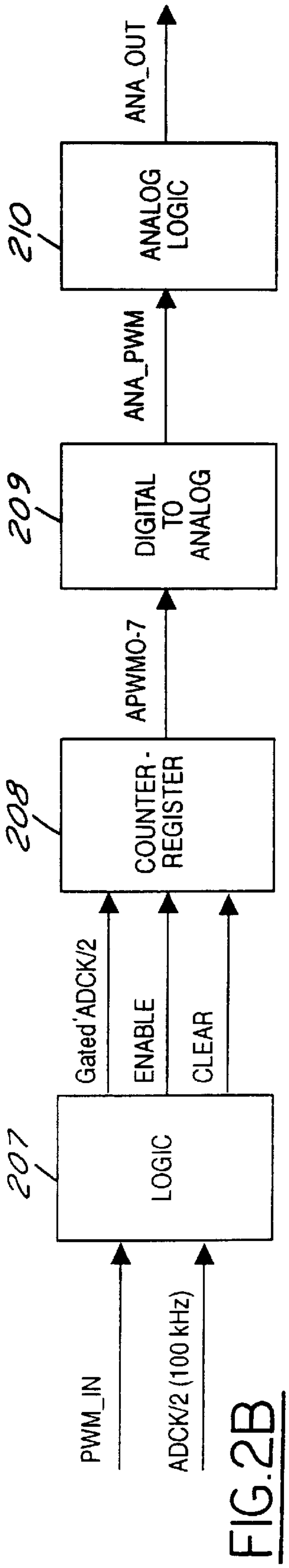
FIG. 2B is a block diagram showing an apparatus for modulating an analog signal with a pulse width input as embodied by this invention.

FIGS. 2A and 2B present the preferred embodiments of the methods portrayed in FIG. 1A and 1B. The block diagram in FIG. 2A shows how to extend the pulse width of a given signal (PWM) with an amount commanded by an analog signal (ANA_IN), and generate a resulting output signal PWM_OUT.

An analog to digital block 201 coverts the analog command signal ANA_IN into a digital signal, suitable for further processing. In this implementation, the analog command input is converted into eight bits of digital information. A 200 kHz clock ADCK runs the A/D converter continuously at a conversion rate of $t_{conv}$=ca 365 us. When the conversion is completed, all the data lines IADB0 through IADB7 are ready and an interrupt signal ADINTRN is generated (logic low for ca. 600 ns).

A block 202 and a block 203 perform a data latch and a select function, respectively. The converted analog signal, available on lines IADB0 through IADB7, is latched into the register of block 202 (such as a 74174) at the rising edge of a signal ADINTRN, which is provided by block 201 upon completion of the conversion. An output data bus of block 202, ADBL0–ADBL7, is fed into multiplexer 203 (such as a 74157). The multiplexer is not a necessary part of the circuit; it is shown here as a means of providing proper (unchanged) output PWM signals in case the analog command input is noisy, spurious, or otherwise invalid. The multiplexer's output state is controlled with signals IN_RANGE and CMD_EN_N, generated externally by the user. If the CMD_EN_N line is high, then the multiplexer's outputs (DB0–DB7) are automatically forced to 0. The user must pull this line low to enable the multiplexers.

Then, the user must decide when or if the analog command at the A/D input is valid and set the IN_RANGE line to 1. When the IN_RANGE=1 (and the CMD_EN_N=0), the multiplexer's output bus DB0–DB7 will reflect the IADB0–IADB7 values. Any other combination of the CMD_EN_N and IN_RANGE values will result in the DB0 through DB7 lines being 0. This 0 output will translate in an output PWM mirroring (equaling) the input PWM, and no modulation occurs. The multiplexers can be removed if this added protection is not necessary, i.e., when the analog signal is guaranteed (by other means) to be always present and in the desired range, or there are other means to provide an always valid analog signal.

A block 204 performs a counter function. The DB0–DB7 bus content is loaded into counter 204 at the falling edge of an input PWM signal (IPWM_CK), after which a countdown starts at the ADCK rate. This countdown translates into a time delay which is proportional to the inverse of the DB0–DB7 content. When the counter content reaches 0, an output flag RCON pulses low. In this application, the ADCK signal rate was chosen at 200 kHz to provide 5 microsecond clock. The combination of this clock rate, and the 8 bit A to D conversion result in the desired 25.6 us delay for every 100 mV analog command.

A logic block 205 is a D flip-flop which generates an output PWM (PWM_OUT). The rising edge of the signal is triggered by the negated input PWM (IPWMN), and the falling edge of RCON, which occurs at the desired delay. A power-on-reset (PonReset) flag provides for predictable initial state of the flip-flop (and other devices in the circuit) after circuit power-up.

A PWM to analog conversion method includes four blocks, shown in FIG. 2B. A logic block 207 receives as input a signal PWM_IN and a 100 kHz (ADCK/2) clock and generates necessary clock (Gated ADCK/2), CLEAR, and ENABLE signals for a COUNTER-REGISTER block 208. The input clock signal, Gated ADCK/2, is ADCK/2 bounded by the PWM_IN signal, so block 208 will only count clock signals as long as the PWM_IN signal is high. The count number will be transferred to the output registers of block 208 approximately at the next positive edge of the PWM_IN signal. (Note a disadvantage: if the PWM_IN stops, then the output register of block 208 will hold the last received PWM_IN pulse width value). The stored values (APWM0–APWM7) are fed into a DIGITAL to ANALOG converter 209 (in this implementation, 8 bits).

Figure 3:
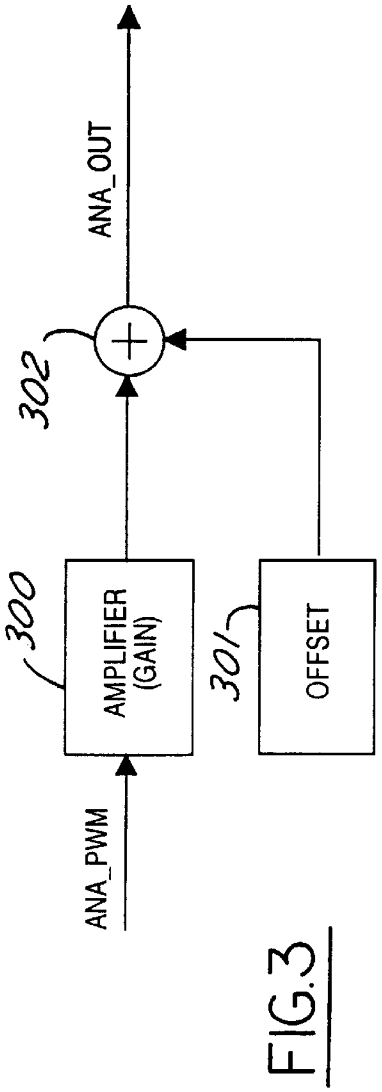
FIG. 3 is a block diagram showing the calibration process used in the embodiment of this invention.

The converter output is passed on to an ANALOG LOGIC block 210 that is comprised of three logic elements. These elements impart adjustable gains and offsets to the ANA_PWM signal as portrayed methodically in FIG. 3. An amplifier 300 applies a gain to the signal, while logic block 301 produces an offset voltage. These two effects are added by summer 302, producing the output signal ANA_OUT.

COUNTER-REGISTER block 208 counts at a rate of 10 us (10 kHz) and the PWM_OUT is in the range of 68 to 1796 us, thus its count number will be in the range of ca. 6 to 179. It may be desirable to use a faster counter to take full advantage of the 8 bit D/A, which accepts a maximum count of 255 ($=2^8-1$). The full scale output of the D/A is set to 2.55 V. The count range then will translate into 68 mV to 1.796 V. Logic block 300 has a calibratable gain of ca. 2.31 to translate further the 68–1796 mV range into 0.157 to 4.15 Volts. Logic block 301 creates a calibratable voltage of ca. 0.343 Volts. The summer 302 adds the two voltages to generate the ANA_OUT signal with the range of 0.5 V to 4.5 V. Due to bias and leakage currents, the 300 and 301 circuits have adjustable gains for fine tuning.

In automotive applications, circuits which modify the spark advance (SA) of an internal combustion engine are controlled by an electronic engine controller (EECIV) with a high-data-rate ignition module (HDRIG). The HDRIG accepts input commands from the EECIV in the form of a PWM signal with a repetition rate proportional to the engine speed. The pulse width (PW) of said signal is in the range of 68 to 1796 microseconds for normal operating conditions. The HDRIG interprets the PW received and generates a spark advance command in the range of 57.5° BTDC (degrees before piston reaches top dead center, positive value) to 10° ATDC (after piston reaches top dead center, negative value). The range of 68 to 1796 microseconds is scaled between 57.5° and −10°, producing the transformation formula: SA(in degrees)=(1540−PW) * 0.0390625, or (delta SA in degrees)=(delta PW in usec) * 0.0390625. In the preferred embodiment, delta SA is restricted to a maximum value of 40 degrees, as it is highly unlikely that a greater change would be commanded.

There are occasions when it is desirable to control (reduce) engine torque without undertaking the tedious and time consuming task of modifying the EECIV control code. One way to reduce engine torque is by retarding spark advance from its current value via a stand alone controller. The HDRIG uses a PWM signal as input, and the stand alone controller, an embodiment of this invention, intercepts the PWM signal and "stretches" it (increasing the PW). The amount of "stretch" would represent the desired additional spark retard and ultimately result in an engine torque reduction, compared with what it would have been without the "stretch". As long as the PW of the modified signal was within the HDRIG's limits, the intervention would be accepted as if it came directly form the EECIV. The particular PWM signal frequency range and PW range determines the clock rates and circuits which are necessary. These circuits can be made generic and programmable for any PWM signal. The complete chain of transformations required to achieve the "stretched" PW is the following:

1. Desired torque reduction to spark retard offset (calculated in the stand alone controller)
2. Desired spark retard offset (DES_SA, degrees) to analog output/analog input:
   (DES_SA) 0–40 deg→(ANA_IN) 0.5 V–4.5 V
3. Analog to digital (with 0.5 V input offset) via National Semiconductor ADC0801 or equivalent:
   (ANA_IN-0.5 V) 0.0 V–4.0 V→(IADB0–7) 0–204 counts [truncated]
4. Counts to time delay (5 us/count) using a 74191 counter:
   (IADB0–7) 0–204 counts→(delta PW) 0–1024 us
5. Delay (delta PW) to added spark retard, done in the HDRIG:
   (delta PW) 0–1024 us→(delta SA) 0–40 deg where (delta SA)=(delta PW) * 0.0390625.

Thus, the overall transfer function of the circuit is: PWM_OUT=IPWMN+(ANA_IN-0.5) * 256, where IPWMN is the unmodulated pulse width signal input from block 14. The overall transformation only occurs if the ANA_IN is deemed in-range by the EECIV, whereby it sets IN_RANGE=1 and CMD_EN_N=0. Had the EECIV deemed the signal out of range or erroneous, IN_RANGE would have been set to 0 and CMD_EN_N to 1, thus commanding a default output of 0.

The reverse is also possible. The PW of the PWM_IN signal is converted back to desired spark retard (SA_DEG, degrees), however, with a different set of transformations than the DES_SA to analog spark advance to PWM conversion, as follows:

1. PWM_IN and ADCK/2 clock signals into ENABLE, CLEAR and Gated ADCK/2 clock signals via a LOGIC block.

The Gated ADCK/2 contains the number of clock pulses generated while PWM_IN is high:

(PMW_IN) 68–1796 us→(Gated ADCK/2) a pulse train of 6–179 pulses [truncated]

2. Pulse train to count conversion:
   (Gated ADCK/2) pulse train of 6–179 pulses→(APWM0–7) 6–179 counts
3. Count (digital) to analog conversion:
   (APWM0–7) 6–179 counts→(ANA_PWM) 60–1790 mV
4. Offset voltage and necessary gain are imparted to the signal to calibrate it to the original analog signal:
   (ANA_PWM) 60–1790 mV→(ANA_OUT) 0.5–4.5 V where ANA_OUT≈(2.31*ANA_PMW)+0.343 V. Again, gain and offset are calibratable.
5. Analog output to desired spark retard, ranging from −10° to 57.5°:
   SA_DEG (spark retard)=16.95*(3.910-ANA_OUT)

Thus, the spark retard has been extracted from a modulated pulse waveform. This output analog signal may be used to check the validity of the PWM being sent to the HRDIG or for feedback to the EECIV.

Various modifications and variations will no doubt occur to those skilled in the various arts to which this invention pertains. Such variations which basically rely on the teachings through which this disclosure has advanced the art are properly considered within the scope of this invention.

We claim:

1. An apparatus for modulating the pulse width of a pulse width signal in response to an analog signal, comprising:

an analog signal to digital signal converter for converting said analog signal into a digital signal;

a register coupled to said converter for holding information from said converter;

a digital logic circuit coupled to said register for converting said information into a number of counts;

a counter coupled to said digital logic circuit for decrementing said counts and sending an output signal upon completion;

a bistable circuit coupled to said counter for extending an incoming dulse width until receipt of said output signal from said counter; and a multiplexer connected between said register and said digital logic circuit for selecting between said analog signal and a default input when said analog signal is deemed erroneous or out-of-range.

2. The apparatus of claim 1, wherein said analog signal is a signal from an electronic engine controller for an internal combustion engine which commands an engine spark retard or advance and said modulated pulse width contains information relating to said engine spark retard or advance.

3. An apparatus for extracting an analog signal from a modulated pulse width signal, comprising:

a bistable circuit for receiving said modulated pulse width signal and for sending an output signal upon change in state;

a counter coupled to said bistable circuit for accumulating a number of counts until receipt of said output signal from said bistable circuit;

a register coupled to said counter for holding said counts;

a digital logic circuit coupled to said counter for converting said counts into a digital signal;

a digital signal to analog signal converter coupled to said counter for converting said digital signal into an analog signal; and an analog logic circuit coupled to said signal converter for calibrating the gain and the offset voltage of said analog signal.

4. The apparatus of claim 3, wherein said modulated pulse width contains information relating to an engine spark retard or advance command from an electronic engine controller for an internal combustion engine and said analog signal is a signal which can be used to command said engine spark retard or advance.

5. A method of converting between an analog signal and a modulated pulse signal, comprising the steps of:

adding a voltage offset to a first analog signal to adjust said first analog signal to be within a predetermined operating range and to provide noise immunity;

converting said first analog signal to a corresponding first digital signal using a analog to digital converter;

sending an output flag from said converter to a first register coupled to said converter upon completion of said converting step;

latching said first digital signal into said first register upon receipt of said flag;

coupling said first digital signal to a multiplexer;

selecting between said first digital signal and a default value with said multiplexer, based upon input flags which verify acceptable digital signal ranges and check for errors.in said first digital signal;

applying the output of said multiplexer to a first counter coupled to said multiplexer;

decrementing said first counter with a first count represented by the output of said multiplexer and sending a flag to a first bistable circuit coupled to said first counter;

modulating a pulse wave input with said first bistable circuit based upon the timing of the receipt of said flag, thereby producing a first output modulated pulse wave signal; and, extracting a second modulating analog signal corresponding to a second output modulated pulse signal by following the steps of:

applying said second modulated pulse signal to a second bistable circuit;

sending a flag from said second bistable circuit to a second counter coupled thereto upon change in state;

incrementing said second counter until receipt of said flag;

applying a second count from said second counter to a second register coupled thereto;

converting said second count from said second register into a second analog signal using a digital to analog converter coupled to said second register; and applying a gain and voltage offset to said second analog signal to calibrate said second analog signal.

* * * * *